(12) United States Patent
Lee et al.

(10) Patent No.: US 7,323,407 B2
(45) Date of Patent: Jan. 29, 2008

(54) METHOD OF FABRICATING DUAL DAMASCENE INTERCONNECTIONS OF MICROELECTRONIC DEVICE USING DIFFUSION BARRIER LAYER AGAINST BASE MATERIAL

(75) Inventors: Kyoung-woo Lee, Seoul (KR); Jae-yeol Maeng, Suwon-si (KR); Jae-hak Kim, Seoul (KR); Il-whan Oh, Seongnam-si (KR); Hong-jae Shin, Seoul (KR)

(73) Assignee: Samsung Electronics Co., Ltd (KR)

( * ) Notice: Subject to any disclaimer, the term of this patent is extended or adjusted under 35 U.S.C. 154(b) by 145 days.

(21) Appl. No.: 11/195,404

(22) Filed: Aug. 2, 2005

(65) Prior Publication Data

US 2006/0063376 A1  Mar. 23, 2006

(30) Foreign Application Priority Data

Aug. 3, 2004  (KR) .............. 10-2004-0061163

(51) Int. Cl.
*H01L 21/311* (2006.01)
*H01L 23/52* (2006.01)

(52) U.S. Cl. ............ 438/623; 438/626; 438/633; 438/638; 438/740; 257/E21.579

(58) Field of Classification Search ......... 438/623, 438/626, 636, 633, 638, 740, FOR. 355; 257/E21.579

See application file for complete search history.

(56) References Cited

U.S. PATENT DOCUMENTS

| | | | |
|---|---|---|---|
| 6,352,945 B1 | 3/2002 | Matsuki, et al. | 438/778 |
| 6,383,955 B1 | 5/2002 | Matsuki, et al. | 438/790 |
| 6,410,463 B1 | 6/2002 | Matsuki | 438/790 |
| 6,432,846 B1 | 8/2002 | Matsuki | 438/790 |
| 6,440,872 B1 | 8/2002 | Mandelman, et al. | 438/745 |
| 6,455,445 B2 | 9/2002 | Matsuki | 438/789 |
| 6,461,955 B1 | 10/2002 | Tsu, et al. | 438/618 |
| 6,514,880 B2 | 2/2003 | Matsuki, et al. | 438/780 |
| 6,559,520 B2 | 5/2003 | Matsuki, et al. | 257/642 |
| 6,858,528 B2 * | 2/2005 | Meagley et al. | 438/629 |
| 6,898,851 B2 * | 5/2005 | Nishioka et al. | 29/852 |

(Continued)

FOREIGN PATENT DOCUMENTS

KR  10-1999-0003782   2/1999

(Continued)

*Primary Examiner*—George Fourson
(74) *Attorney, Agent, or Firm*—Mills & Onello LLP

(57) ABSTRACT

Methods of fabricating dual damascene interconnections suitable for use in microelectronic devices and similar applications using a diffusion barrier layer to protect against base materials during processing are provided. The methods include the steps of: filling a via with a hydrogen silsesquioxane (HSQ)-based filler as expressed by the general chemical formula: $(RSiO_{3/2})x(HSiO_{3/2})y$, wherein x and y satisfy the relationships $x+y=1$ and $0<x<y<1$, and R is selected from C4-C24 alkyl, C4-C24 alkenyl, C4-C24 alkoxy, C8-C24 alkenoxy, substituted C4-C24 hydrocarbon, non-substituted C1-C4 hydrocarbon or substituted C1-C4 hydrocarbon; and, partially etching the filler filling the via and an interlayer dielectric to form a trench, which is connected to the via in the region where the dual damascene interconnections are to be formed. Then, the filler remaining in the via is removed, and the trench and the via are filled with an interconnection material to complete the dual damascene interconnections.

43 Claims, 11 Drawing Sheets

U.S. PATENT DOCUMENTS

| | | | |
|---|---|---|---|
| 7,018,920 B2 * | 3/2006 | Meagley et al. | 438/629 |
| 2004/0058538 A1 | 3/2004 | Park, et al. | 438/689 |
| 2004/0132291 A1 | 7/2004 | Lee, et al. | 438/689 |
| 2004/0183203 A1 * | 9/2004 | Meagley et al. | 257/774 |
| 2005/0124152 A1 * | 6/2005 | Meagley et al. | 438/631 |

FOREIGN PATENT DOCUMENTS

| | | |
|---|---|---|
| KR | 2003-0048454 | 6/2003 |
| KR | 1020040010130 | 1/2004 |
| WO | WO 02/37542 | 5/2001 |

* cited by examiner

METHOD OF FABRICATING DUAL DAMASCENE INTERCONNECTIONS OF MICROELECTRONIC DEVICE USING DIFFUSION BARRIER LAYER AGAINST BASE MATERIAL

This application claims priority from Korean Patent Application No. 2004-061163 filed on Aug. 3, 2004 in the Korean Intellectual Property Office, the disclosure of which is incorporated herein by reference in its entirety.

BACKGROUND OF THE INVENTION

1. Field of the Invention

The present invention relates to a method of fabricating a microelectronic device, and more particularly, to a method of fabricating dual damascene interconnections for use in or with a microelectronic device.

2. Description of the Related Art

As microelectronic devices have become more efficient and highly integrated, multi-layered interconnections are more widely used in fabricating such devices. To obtain a reliable device including multi-layered interconnections, each interconnection layer is preferably formed in a planar fashion. To achieve such a planar configuration, dual damascene interconnections have become a familiar fabrication technique.

Among methods of fabricating dual damascene interconnections that have lately attracted considerable attention, one widely used technique is to fill a via with a filler made of such materials as spin-on-glass (SOG), spin-on-polymer (SOP), SOG with a dye, SOP with a dye, or the like. When the via is not filled with a filler, the via may create a step height at a photoresist layer coated for forming a trench, resulting in a reduction in the depth of focus (DOF) margin; also, an etch stop layer may be etched during etching and cleaning steps thereby exposing a lower interconnection, and possibly degrading electrical properties of the lower interconnection.

However, when a via is filled with a conventional filler 20, as shown for example in FIG. 1, a base material, such as nitrogen or amine, remaining in an interlayer dielectric (to be abbreviated as "ILD" hereinbelow) 18, which may result from an ashing process performed for removing a photoresist pattern for patterning a via 19 using nitrogen-based plasma, is easily diffused along the filler 20, as indicated by an arrow labeled 27, exhibiting outgassing. Such diffused base material will tend to neutralize acids ($H^+$) generated in an exposure portion 22b of a photoresist layer 22 exposed by exposure light 26 which has been transmitted through a transmission region 25 of a mask 24 used in forming a trench. As a result, an exposure portion 22b of photoresist layer 22 and upper regions around the via 19 may not be properly dissolved in a developer, resulting in photoresist poisoning, that is, a photoresist pattern is not properly formed. In FIG. 1, reference numeral 10 denotes a substrate, 12 a lower ILD, 14 a lower interconnection, and 16 an etch stop layer, respectively.

FIG. 2 is a scanning electron microscope (SEM) image illustrating the product of a conventional method of fabricating conventional dual damascene interconnections using methyl silsesquioxane (MSQ) with a dye as a via filling material. As shown in FIG. 2, a photoresist pattern having a poor profile is formed on the via 19 or no photoresist pattern is formed at all. Accordingly, improvement in the techniques of fabricating dual damascene interconnections in a reliable manner is highly required.

SUMMARY OF THE INVENTION

To solve some or all of the above-described problems, it is an object of the present invention to provide a method for reliably fabricating dual damascene interconnections with improved properties and/or performance.

The above stated object as well as other objects, features and advantages, of the present invention will become clear to those skilled in the art upon review of the following description.

According to one aspect of the present invention, there is provided a method of fabricating dual damascene interconnections including the sequential steps of: (a) forming a low-k interlayer dielectric layer on a suitable substrate; (b) forming a via within the interlayer dielectric layer; (c) filling the via with a hydrogen silsesquioxane (HSQ)-based filler expressed by the following general chemical formula: $(RSiO_{3/2})x(HSiO_{3/2})y$, where x and y satisfy the relationships/conditions that $x+y=1$ and $0<x<y<1$, and R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups, and substituted C1-C4 hydrocarbon groups; (d) partially etching the filler filling the via and the interlayer dielectric layer to form a trench, which is connected to the via and in which the dual damascene interconnections are to be formed; (e) removing the filler remaining in the via; and (f) filling the trench and the via with an interconnection material to complete the dual damascene interconnections according to this invention.

According to another aspect of the present invention, there is provided a method of fabricating dual damascene interconnections including the sequential steps of: (a) forming a low-k interlayer dielectric layer on a suitable substrate; (b) forming a via within the interlayer dielectric layer; (c) forming a filler for a mask which is made of spin-on-polymer (SOP) that fills the via and covers the interlayer dielectric layer; (d) forming a diffusion barrier layer against base materials, which is made of HSQ or an HSQ-based material, on an upper portion of the filler, the HSQ-based material being expressed by the general chemical formula: $(RSiO_{3/2})x(HSiO_{3/2})y$, where x and y satisfy the relationships/conditions that $x+y=1$ and $0<x<y<1$, and R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups, and substituted C1-C4 hydrocarbon groups; (e) forming a photoresist pattern defining a trench area where the dual damascene interconnections are to be formed on the diffusion barrier layer; (f) etching the diffusion barrier layer against the base materials using the photoresist pattern as an etch mask to form a diffusion barrier layer pattern; (g) etching the filler on the interlayer dielectric layer using the photoresist pattern and the diffusion barrier layer pattern as an etch mask to form a multi-stack mask including the diffusion barrier layer pattern and a filler pattern; (h) partially etching the interlayer dielectric using the multi-stack mask as an etch mask to form the trench, which is connected to the via and in which the dual damascene interconnections are to be formed; (i) removing the multi-stack mask and the filler remaining in the via; (j) removing the etch stop layer exposed by the via to expose a lower interconnection; and (k) filling the trench and the via with an interconnection material to complete the dual damascene interconnections according to this invention.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
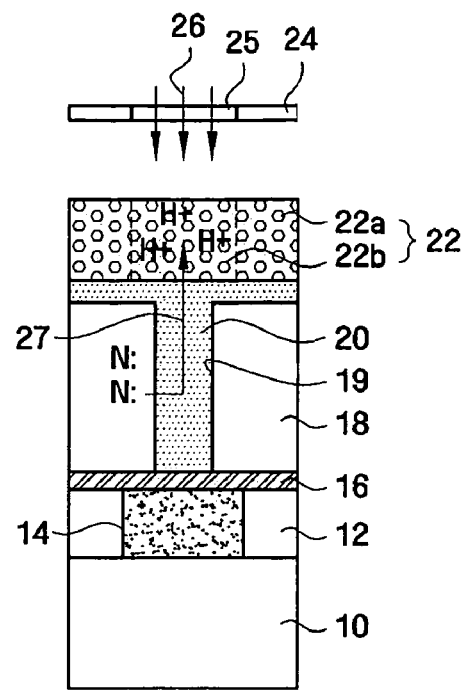
FIG. 1 is a schematic cross-sectional view illustrating a conventional method of fabricating conventional dual damascene interconnections.
Figure 2:
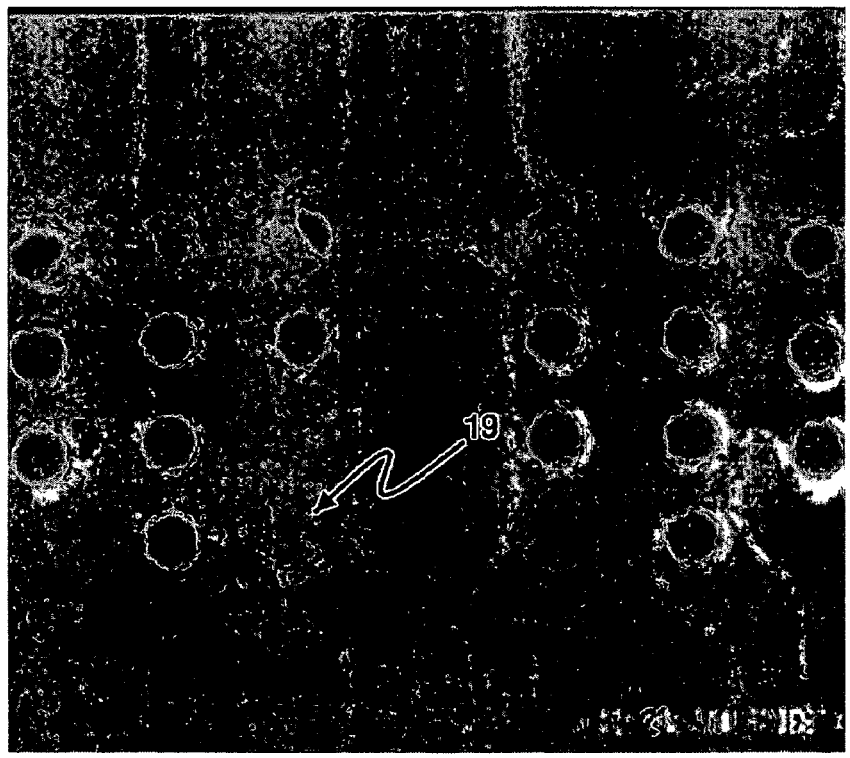
FIG. 2 is a scanning electron microscope (SEM) image illustrating a product formed by a conventional method of fabricating conventional dual damascene interconnections such as that shown in FIG. 1.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will also be defined by the appended claims. In general, for easy comparison, like reference numerals refer to like elements throughout the specification, specifically in different figures of the drawings.

In embodiments of the present invention, in order to prevent RC delay and to minimize cross talk and power consumption, an interlayer dielectric (ILD) on which dual damascene interconnections are to be formed may be formed of a low-k dielectric material. The low-k dielectric material refers to a material having dielectric constant of about 3.3 or lower. Among the materials having a low-k dielectric constant of about 3.3 or less, a hybrid low-k material can be used. The hybrid low-k material may be selected or designed to have at least some of the advantages of both organic and inorganic materials. For example, the hybrid low-k dielectric material may be selected to show low-k characteristics like an organic material. Also, a hybrid low-k dielectric material can be formed using a conventional apparatus and process since it has a modified structure from a conventional inorganic silicate oxide and is thermally stable.

In the exemplary embodiments of the present invention, a via filler or a mask layer of a multi-stack mask may be formed of a material capable of serving as a diffusion barrier layer against base materials such as nitrogen or amine ions. Also, the via filler or the mask layer of a multi-stack mask may be formed of a material that can function not only as an anti-reflecting layer but also as a barrier layer to base materials. Accordingly, a method of fabricating robust and reliable dual damascene interconnections can be provided by using such materials.

The present invention can be advantageously applied to various types of microelectronic devices, such as highly integrated circuit semiconductor devices, processors, micro electromechanical systems (MEMS) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Hereinafter in a structure or device according to this invention, an opening exposing a lower interconnection is referred to as a via, and a region where interconnections will be formed is referred to as a trench. The present invention will now be described by way of an example of a via-first dual damascene process, in which, even if misalignment occurs, the size of a via can be held constant.

Hereinafter, a method of fabricating dual damascene interconnections according to an embodiment of the present invention will be described with reference to FIGS. 3 to 13.

Figure 3:
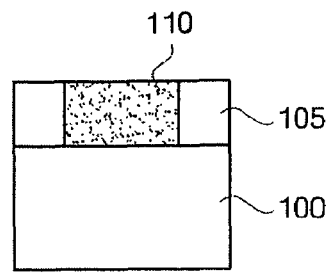
FIGS. 3 to 13 are schematic cross-sectional views illustrating sequential steps in a method of fabricating dual damascene interconnections according to a first embodiment of the present invention.

First, as shown in FIG. 3, a substrate 100, to which the method of fabricating the dual damascene interconnections according to the present invention will be applied, is prepared. A lower ILD 105 having a lower interconnection 110 is formed on the substrate 100. The substrate 100 may be, for example, a silicon substrate, a silicon on insulator (SOI) substrate, a gallium arsenide substrate, a silicon germanium substrate, a ceramic substrate, a quartz substrate, or a glass substrate for display. Various active devices and passive devices as is known in the art may be formed on the substrate 100. The lower interconnection 110 may be formed of various kinds of interconnection materials, such as copper, copper alloy, aluminum, and aluminum alloy. The lower interconnection 110 is preferably formed of copper because of its low resistance. Also, the surface of the lower interconnection 110 is preferably planarized.

Figure 4:
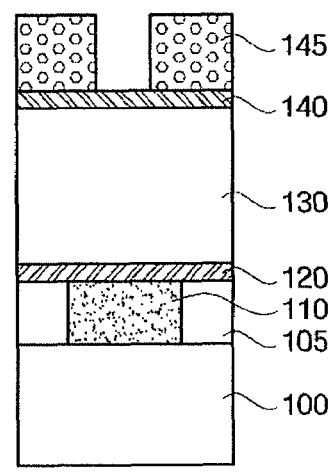

Referring to FIG. 4, an etch stop layer 120, a low-k ILD 130, and a capping layer 140 are sequentially stacked on the entire surface of the substrate 100 where the lower interconnection 110 is formed, and a photoresist pattern 145 is formed on the capping layer 140 to define a via.

The etch stop layer 120 is formed to prevent electrical properties of the lower interconnection 110 from being damaged during a subsequent dry etch process for forming a via and a subsequent wet etch process for removing the remaining filler. Accordingly, the etch stop layer 120 is preferably formed of a material having a high etch selectivity with respect to the ILD 130 formed thereon. Preferably, the etch stop layer 120 is formed of SiC, SiN, or SiCN, having a dielectric constant of about 4 to 5. The etch stop layer 120 would generally be formed as thin as possible in consideration of the dielectric constant of the entire ILD, but still thick enough to properly function as an etch stop layer.

The ILD 130 is preferably formed of a hybrid low-k dielectric material, which has advantages of organic and inorganic materials. That is, a preferred ILD 130 would be formed of the hybrid low-k dielectric material, have low-k characteristics, could be formed using a conventional apparatus and process, and would be thermally stable. The ILD 130 is also preferably formed of a hybrid material having a dielectric constant of about 3.3 or less to prevent an RC delay between the lower interconnection 110 and the dual damascene interconnections as well as to minimize cross talk and power consumption. Most preferably, the ILD 130 is formed of low-k organo silicate glass (OSG). The ILD 130 formed of low-k OSG can be formed, for example, using chemical vapor deposition (CVD), more specifically, plasma-enhanced CVD (PECVD). As the carbon content in an OSG layer increases, the dielectric constant of the OSG layer decreases, but thermal and mechanical characteristics are also typically degraded. However, if an OSG layer is formed using CVD, the carbon content in the OSG layer can be adjusted to appropriately control the tradeoff between the dielectric constant and the thermal and mechanical characteristics of the OSG layer. Therefore, an OSG layer can be formed using CVD which is suitable for the ILD 130. It will be understood by those skilled in the art that various changes may be made by known methods in the source gas (e.g., carbon source gas, silicon source gas, and oxygen source gas), a CVD chamber, and fabricating conditions (e.g., temperature and time conditions) used for forming the OSG layer using CVD. A method of forming OSG using CVD may be a known method or specifically the methods disclosed in U.S. Pat. No. 6,455,445, U.S. Pat. No. 6,432,846, U.S. Pat. No. 6,514,880, U.S. Pat. No. 6,559,520, U.S. Pat. No. 6,352,945, U.S. Pat. No. 6,383,955, and U.S. Pat. No. 6,410,463, and Korean Patent No. 0364053, each of which is incorporated herein by reference in its entirety as fully disclosed in the present invention. The ILD 130 is preferably formed to a thickness of about 3000 Å to about 20000 Å, more preferably, about 6000 Å to about 7000 Å. However, the ILD 130 can be formed to various thicknesses as will be understood by those skilled in the art.

When the dual damascene interconnections are being planarized using chemical mechanical polishing (CMP), the capping layer 140 prevents the ILD 130 from being damaged by the CMP. Thus, the capping layer 140 is preferably formed of $SiO_2$, SiOF, SiON, SiC, SiN, or SiCN. Preferably, the capping layer 140 also functions as an anti-reflection layer (ARL) in a subsequent photolithographic process for forming a trench. Accordingly, the capping layer 140 is more preferably formed of $SiO_2$, SiON, SiC, or SiCN among the materials mentioned above. However, if damage to the ILD 130 can be adequately minimized or prevented by controlling the CMP process, and if an anti-reflective material layer is or can be formed in a subsequent process, the formation of the capping layer 140 may be optionally omitted.

The photoresist pattern 145 is formed by forming a layer of a photoresist that is suitable for a light source having a wavelength of about 248 nm or less and then performing exposure using a photo mask defining a via and related developing processes.

Figure 5:
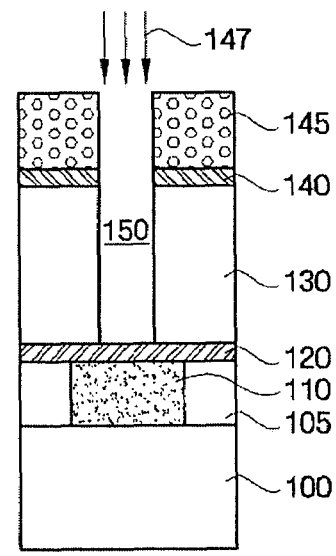

Referring to FIG. 5, in the next set of process steps the ILD 130 is dry etched (147) using the photoresist pattern 145 as an etch mask to form a via 150. The ILD 130 is preferably dry etched using a reactive ion beam etch (RIE) process, which uses a mixture of a main etch gas, e.g., one having the general chemical formula $C_xF_y$ or $C_xH_yF_z$, a substantially inert gas, e.g., Ar gas, and optionally at least one of $O_2$, $N_2$ and $CO_x$. For practicing this invention, the RIE conditions are adjusted such that only the ILD 130 is selectively etched and the etch stop layer 120 is not etched.

Figure 6:
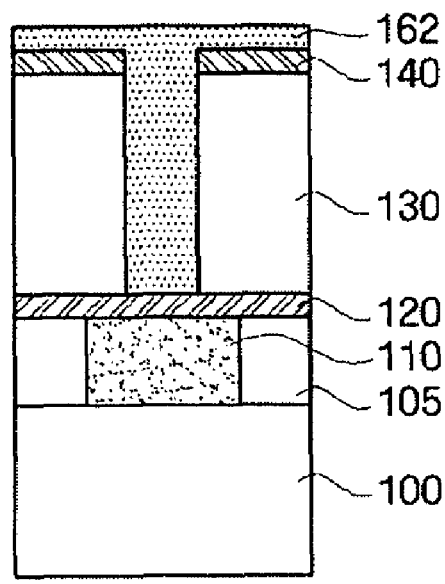

Referring next to FIG. 6, the photoresist pattern 145 of FIG. 5 is removed and the via 150 as shown in FIG. 5 is filled with a via filler 162. The photoresist pattern 145 is preferably processed using $H_2$-based plasma and then removed using a stripper. $H_2$-based plasma refers to plasma obtained from $H_2$, $N_2/H_2$, $NH_3/H_2$, $He/H_2$, or a mixture thereof. If the photoresist pattern 145 were removed using $O_2$ plasma ashing, a process widely used for removing a photoresist pattern, the ILD 130 (selected or prepared to contain carbon so as to have some organic properties) might be damaged by the $O_2$-based plasma. Thus, the photoresist pattern 145 is preferably removed using $H_2$-based plasma.

During an exposure process for forming a photoresist pattern to define a subsequent trench, base materials, such as nitrogen and amine ions, which may be included in the ILD 130, may diffuse into a photoresist layer. Thus, the via filler 162 is preferably formed of a material that can prevent the diffusion of such base materials into the photoresist layer. In addition, the via filler 162 is preferably formed of a material having an anti-reflecting property relative to the exposure light. Furthermore, the via filler 162 is preferably formed of a material having a good gap filling characteristic. At the same time, it is also preferred that a dry etch selectivity of the via filler 162 relative to the ILD 130 be either about 1:1 or about 4:1 or less. Further, the via filler 162 is preferably formed of a material that is etched at a higher etch rate than the ILD 130 in a subsequent wet etch process. Preferably, too, the via filler 162 is formed of a material having such a characteristic that a wet etch selectivity of the via filler 162 relative to the ILD 130 is about 20:1 or higher.

Given the foregoing conditions, it has been found that a material having various kinds of hydrocarbon groups bonded to one or more positions along the backbone of hydrogenSilsesQuioxane (HSQ), herein referred to as an "HSQ-based material," is the most suitable material for the via filler 162. The HSQ-based material suitable for the via filler 162 of the first embodiment of the present invention can be expressed by the general chemical formula (1) below:

$$(RSiO_{3/2})x(HSiO_{3/2})y \qquad (1)$$

wherein x and y satisfy the relationships/conditions that x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups and substituted C1-C4 hydrocarbon groups.

The terms "alkyl", "alkenyl", "alkoxy" and "alkenoxy" as used herein are used to embrace generally the classes of aliphatic hydrocarbons, substituted hydrocarbons and aromatic hydrocarbons. Specifically, "substituted hydrocarbon" includes C and H constituents and refers to a structure including at least one atom which does not substantially react to HSQ. Further, "non-substituted hydrocarbon" refers to a structure including C and H constituents such as methyl, ethyl, propyl, butyl, t-butyl.

For example, R may be a C4-C24 alkyl group, more particularly a C6-C24 alkyl group, and even more particularly a C16-C22 alkyl group. Further, R may be a C4-C24 alkenyl group and more particularly a C8-C24 alkenyl group. R may also be a C4-C24 alkoxy group and more particularly a C16-C22 alkoxy group. R may also be a C8-C24 alkenoxy group and more particularly a C16-C22 alkenoxy group.

R may also be a tetramethyl hydroxyhexadecyl or octadecyl group. R may also be a t-butoxy group.

Further, the via filler 162 also preferably includes a dissolution inhibitor. The dissolution inhibitor, which inhibits dissolution of a photoresist developer, may be a suitable material selected from among those known by those skilled in the art. The functions of the dissolution inhibitor in connection with this invention will be described hereinafter.

In a first step, the material that will comprise the via filler 162 is preferably dissolved in a suitable solvent such as isobutyl, isobutylate, mesitylene, cyclohexanon, xylene, methyl isobutylketone, or a compound thereof. In the next step, the via filler 162 is formed using a suitable technique, such as spin coating, to completely fill the via 150 (as shown in FIG. 5). While it is possible to fill only the via 150 with the via filler 162, the via filler 162 is preferably also formed on the capping layer 140 to a predetermined thickness in consideration of process margin control. Also, it is preferable in terms of providing a DOF margin that a difference between the height T1 of the via filler 162 formed in a low via-density region and the height T2 of the via filler 162 formed in a high via-density region be about 2,000 Å or less. The thickness of HSQ-based material forming the via filler 162 can be easily controlled by adjusting variables such as coating recipe, the space between adjacent vias 150, the critical dimension, the height of the via 150, and the condition (T1-T2≦about 2,000 Å).

Figure 7:
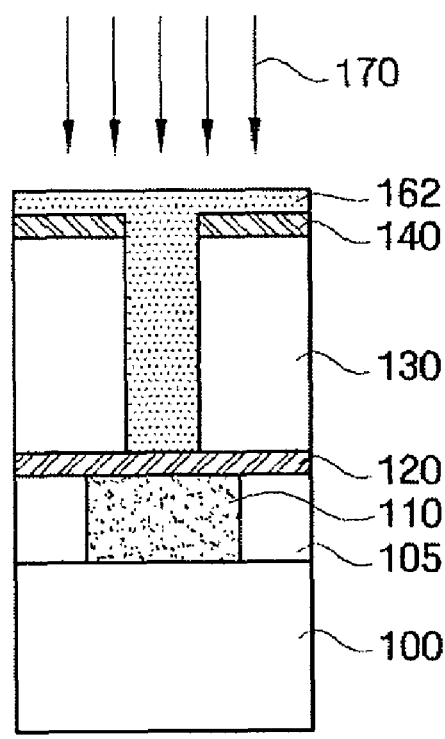

Referring next to FIG. 7, the surface of the via filler 162 is processed by treatment with plasma 170. The plasma 170 is preferably derived from plasma of $O_2$, $H_2$, He, $NH_3$, $N_2$, Ar, or a mixture thereof, and the plasma processing is conducted at a temperature ranging from about room temperature to about 500° C. for a period of about 1 to 120 seconds. The surface of the via filler 162 is densified by this plasma processing. Also, the plasma processing is carried out to prevent a photoresist developing solution from dissolving the via filler 162. Accordingly, if the via filler 162 includes a dissolution inhibitor, as referenced previously, the plasma processing may be optionally omitted.

Figure 8:
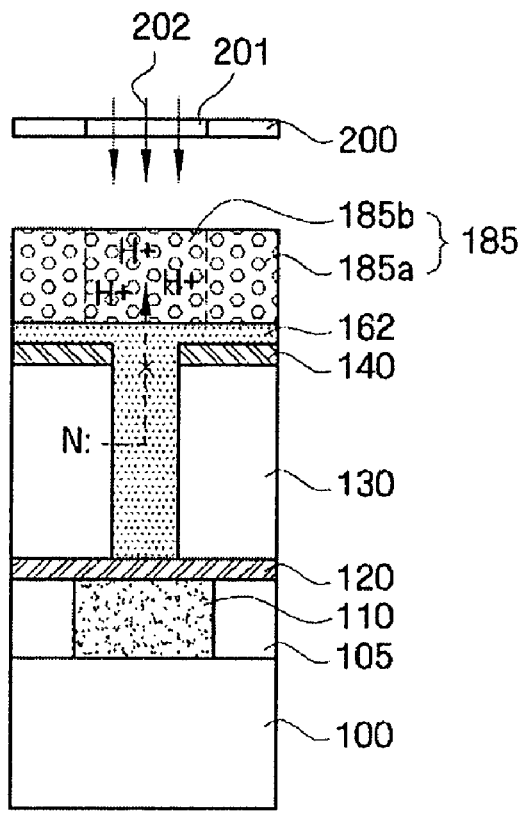

Referring next to FIG. 8, after forming a photoresist layer 185 on the surface of the via filler 162, the photoresist layer 185 is exposed to light of a suitable wavelength using a mask 200 to define a trench. If exposure light having a wavelength of 248 nm, 193 nm, or less is transmitted through a transmission region 201 of the mask 200 and radiated onto the photoresist layer 185, acids (H+ ions) are generated from a photo acid generator which is included in at least an exposure portion 185b of the photoresist layer 185. As shown in FIG. 8, the via filler 162 on a lower portion of the exposure portion 185b prevents light rays penetrating the photoresist layer 185 from being reflected back to the photoresist layer 185. The acids H+ generated in the exposure portion 185b hydrolyze the photoresist layer 185 into a material that is soluble in a developing solution. After the exposure process, acidolysis becomes more active by employing a post-exposure baking (PEB) process. During the exposure process and the subsequent PEB process, the via filler 162 functions as a diffusion barrier layer to nitrogen or amine. Accordingly, base materials (N:), such as nitrogen and amine, which remain in the ILD 130 due to the etch gas used for etching the via 150 as well as because of the plasma processing used for removing the photoresist pattern (145 of FIG. 4) used for defining the via 150, cannot diffuse (as depicted by a dotted line through the via filler 162) and neutralize the acids H+ generated in the exposure portion 185b. Thus, because the via filler 162 functions as an effective diffusion barrier layer, photoresist poisoning is prevented or at least minimized.

Figure 9:
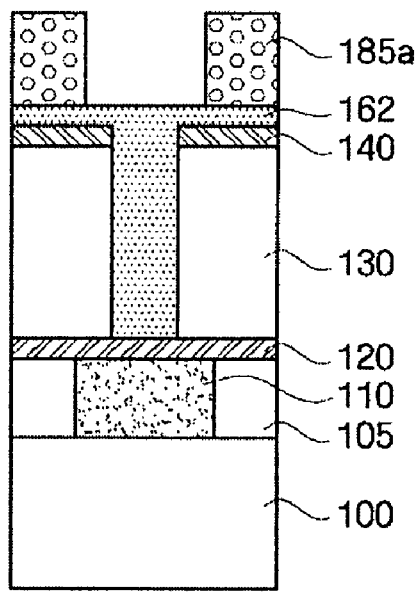

Referring next to FIG. 9, a photoresist pattern 185a is formed in photoresist layer 185. When the post-exposure baked photoresist layer 185 is soaked in a tetramethyl ammonium hydroxide developing solution, only the exposure portion 185b is dissolved in the developing solution. Thus, as shown in FIG. 9, the photoresist pattern 185a is obtained. If the via filler 162 was processed using plasma or includes a dissolution inhibitor, as discussed previously, it will not be damaged by the developing solution.

Figure 10:
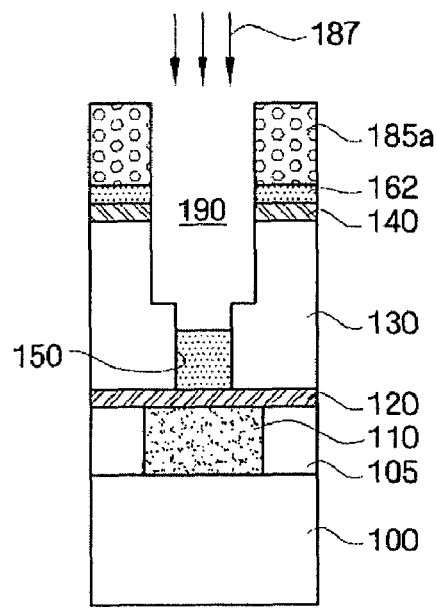

FIG. 10 shows the formation of a trench 190 in the structure/device of FIG. 9. The via filler 162 and the capping layer 140 are sequentially etched using the photoresist pattern 185a as an etch mask, and then the ILD 130 and the via filler 162 are also etched to a predetermined depth thereby forming the trench 190 as shown in FIG. 10. The trench 190 is preferably dry etched, as illustrated by the arrows 187, under the process condition that an etch ratio of the ILD 130 relative to the via filler 162 is about 4:1 or less. Therefore, so-called fence defects, which can remain on sidewalls of the via filler 162 due to unetched ILD 130, can be prevented. Also, since a portion of the via filler 162 preferably still remains in the via 150 after this dry etching step, it can prevent the etch stop layer 120 from being etched which could lead to damage to the lower interconnection 110. If the ILD 130 is formed of an OSG and the via filler 162 is formed of an HSQ-based material, both of them will have the usual characteristics of inorganic materials. Thus, if an RIE process is carried out using a mixture of a main etch gas, e.g., one having a general chemical formula CxFy or CxHyFz, together with an inert gas, e.g., Ar gas, and optionally at least one of $O_2$, $N_2$, and COx, the foregoing etch ratio condition for etching the trench 190 can be readily satisfied.

Figure 11:
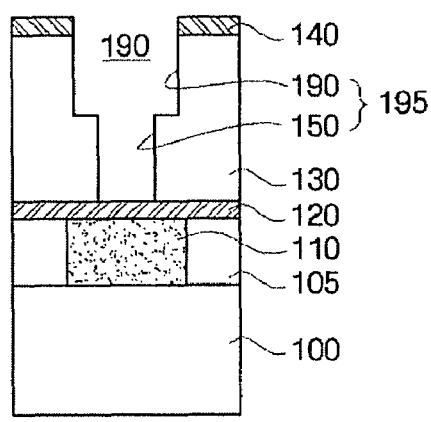

FIG. 11 is a cross-sectional view of the resultant structure in FIG. 10 from which the photoresist pattern 185a and the remaining via filler 162 have been removed. After the etching of the trench 190 has been completed, the photoresist pattern 185a is then removed preferably using $H_2$-based plasma obtained from $H_2$, $N_2/H_2$, $NH_3/H_2$, $He/H_2$, or a mixture thereof. Next, the via filler 162 is removed, thereby forming a dual damascene interconnection region 195, which includes the via 150 and the trench 190. In this process step, the remaining via filler 162 is preferably removed using a wet etch process. The wet etch process for removing the via filler 162 is preferably carried out under the process condition that the ILD 130 is only slightly etched while the via filler 162 is selectively removed, i.e., that a wet etch ratio of the via filler 162 relative to the ILD 130 should be about 20:1 or higher. Also, the via filler 162 should have an etch selectivity with respect to the etch stop layer 120. While the ILD 130 has organic characteristics, the via filler 162 and the etch stop layer 120 are preferably formed of inorganic materials. Thus, to satisfy the wet etch ratio condition, the via filler 162 is preferably removed by wet etching using an etchant having a high selectivity with respect to organic materials. In particular, if the via filler 162 is formed of an HSQ-based material, the ILD 130 is formed of an OSG, and the etch stop layer 120 is formed of SiC(N), the via filler 162 may be wet etched using an HF solution diluted with deionized water (DIW), or using a buffered oxide etchant (BOE), which is a mixture of $NH_4F$, HF, and deionized water. Preferably, the diluted HF solution is in a ratio of about 100(DIW):1(HF) or higher. Thus, an etch ratio of HSQ-based material to OSG to SiC(N) can be attained that is higher than 100:1:1. In addition, etching of the ILD 130 can be prevented during the removal of the via filler 162 so as to precisely control the critical dimension of the trench 190. Additional details about the via etching, the trench etching, and the wet etching steps discussed above are disclosed in published Korean Patent Application No. 2002-57192, which is commonly owned by the same assignee. This Korean patent application is incorporated herein by reference in its entirety as fully disclosed in the present invention.

Figure 12:
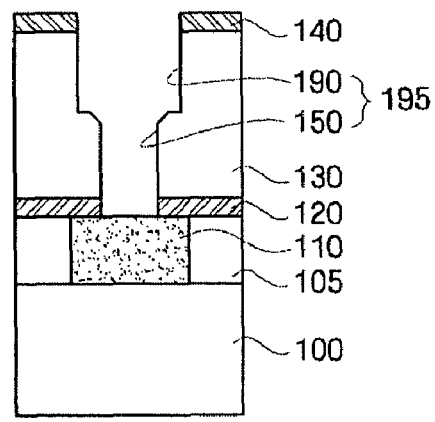

Referring next to FIG. 12, the portion of the etch stop layer 120 which is exposed to the via 150 is now etched so that the lower interconnection 110 is exposed and the dual damascene region 195, comprised of the via 150 and the trench 190, is completed. The etch stop layer 120 is etched under the process condition that the etching of the etch stop layer 120 does not affect the lower interconnection 110 and such that only the portion of etch stop layer 120 which is exposed to the via 150 is removed selectively.

Figure 13:
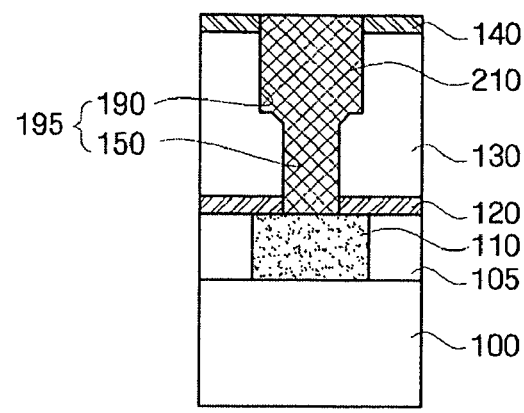

Referring next to FIG. 13, a conductive layer 210 is formed in the dual damascene region 195 and then is planarized so that dual damascene interconnections are completed. The conductive layer can be selected from aluminum, tungsten, copper or an alloy thereof, and copper is most preferable from the viewpoint of low resistance. Further, a diffusion barrier layer and/or a main interconnection layer can also be formed in a laminated structure, and a method of forming a copper interconnection can be variously changed using technologies known to those skilled in the art.

It will be understood by those skilled in this art that the method of fabricating the via-first dual damascene interconnections of the present invention, as explained above with reference to FIGS. 3 to 13, can similarly be applied to a method of fabricating trench-first dual damascene interconnections, also in accordance with this invention.

A method of fabricating dual damascene interconnections according to a second embodiment of the present invention is explained below with reference to FIGS. 14 to 23. The method of fabricating the dual damascene interconnections according to the second embodiment of the present invention relates to a method of forming a trench using a multi-stack mask.

Figure 14:
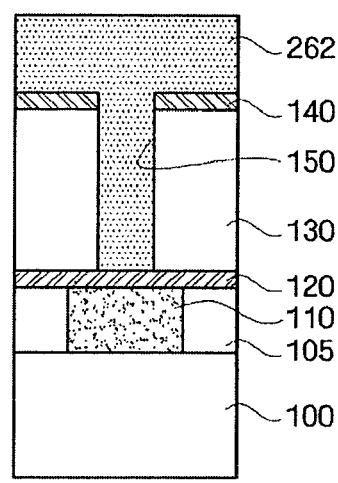
FIGS. 14 to 23 are schematic cross-sectional views illustrating sequential steps in a method of fabricating dual damascene interconnections according to a second embodiment of the present invention.

Referring to FIG. 14, the sequential processes performed up to and including the step of forming a via 150 are generally the same as the processes of the first invention embodiment. Subsequently, as shown in FIG. 14, the via 150 is filled with a via filler 262 for a mask (i.e., FIG. 14 generally corresponds to FIG. 6). As taught in connection with the first invention embodiment, when a trench is etched and cleaned, there is the possibility that an etch stop layer 120 may be etched to expose a portion of lower interconnection 110, thereby degrading the electrical properties of the lower interconnection 110. Thus, the via filler 262 for the mask is preferably formed to prevent degradation of the electrical properties of the lower interconnection 110 during the trench formation steps and specifically to serve as an etch mask in the trench etching process. In order to form dual damascene interconnections having fine line widths according to a design rule of 0.18 μm, and even as little as 90 mm or less, a photoresist layer transparent to exposure light having a wavelength of 248 nm or less (that is, deep ultraviolet-UV) must be formed. However, the photoresist layer for the deep UV typically has a low resistance to dry etching so that a photoresist pattern is generally removed in the dry etching process for forming the trench, thereby causing poor dry etching process results. Thus, the via filler 262 used for the mask for this invention embodiment is preferably formed for forming a multi-stack mask instead of a single photoresist pattern.

Therefore, the via filler 262 for the mask is preferably formed of a material which has not only a good gap filling characteristic but also a good resistance to the dry etching process used for forming the trench. Further, since it is preferable that the via filler 262 not be exposed when the photoresist layer formed thereon is exposed, the via filler 262 can be formed of a material that is substantially opaque to exposure light having a wavelength of 248 nm, 193 nm, or less used in a photolithographic etching process. Thus, spin-on-polymer (SOP) can be used effectively as the via filler 262 for the mask in this invention embodiment. Examples of SOPs include photoresist for i-line and other known SOPs.

The via filler 262 for completely filling the via 150 is formed for example by a spin coating method. The via filler 262 can be formed on the ILD 130 and on a capping layer 140 to a predetermined height in consideration of the function of a subsequent etch mask operation. For example, the predetermined height can advantageously be in the range of about 1,000-10,000 Å.

Figure 15:
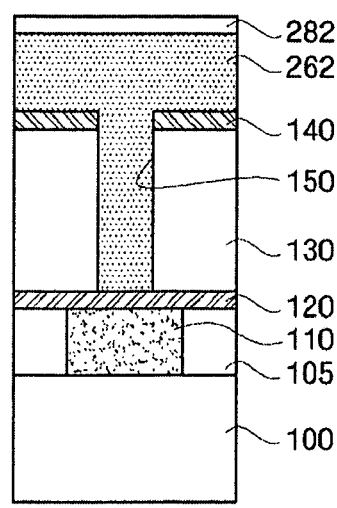

Referring now to FIG. 15, a diffusion barrier layer 282 selected to protect against base materials is formed on the via filler 262. The diffusion barrier layer 282 to protect against base materials is preferably formed of a material which can block base materials, such as nitrogen or amine, included in the ILD 130 from diffusing into the photoresist layer during a subsequent exposure process for forming a photoresist pattern defining the trench. Further, the diffusion barrier layer 282 to protect against the base materials is also preferably formed of a material having an anti-reflecting function against exposure light and/or a material further including a dissolution inhibitor. Thus, the HSQ-based material or HSQ, as discussed in connection with the first invention embodiment, are also suitable for the diffusion barrier layer 282 to protect against the base material.

Hereinafter, although not shown in the Figures, the plasma processing step of treating a surface of the diffusion barrier layer 282 to protect against the base materials can also be performed. Such a plasma processing step may be performed using plasma of $O_2$, $H_2$, He, $NH_3$, $N_2$, Ar or a mixture thereof at a temperature of about room temperature to about 500° C. for a period of about 1 second to 120 seconds. For some applications, it can be more preferable that plasma of $O_2$, $H_2$, He, Ar or a mixture thereof be used to prevent nitrogen from entering or diffusing through the diffusion barrier layer 282 used to protect against the base material. The surface of the diffusion barrier layer 282 used to protect against the base materials can also be densified by the plasma processing step. Also, the plasma processing step helps to prevent the diffusion barrier layer 282 from being dissolved in a photoresist developing solution used in subsequent processing steps. In a case where the diffusion barrier layer 282 includes the dissolution inhibitor, however, the plasma processing step can typically be omitted.

Figure 16:
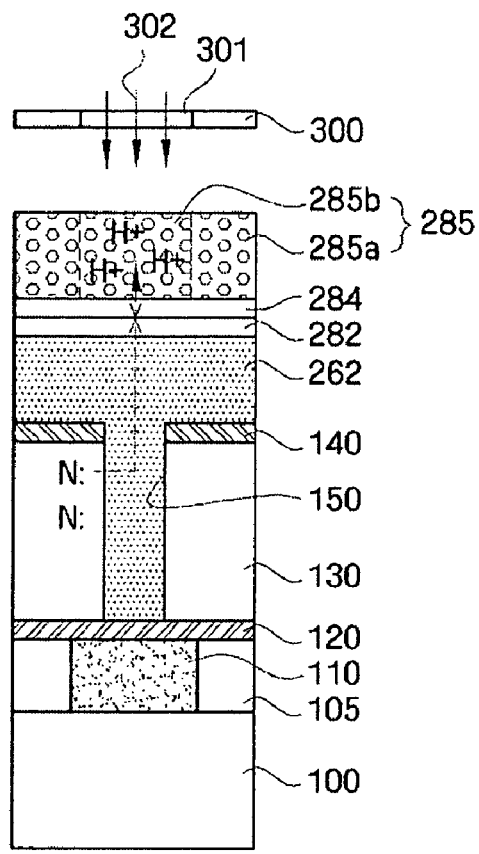

Referring next to FIG. 16, an anti-reflecting layer 284 is formed on the diffusion barrier layer 282. Either an inorganic anti-reflecting layer or an organic anti-reflecting layer ordinarily may be selected as the anti-reflecting layer 284. However, an organic anti-reflecting layer may be advantageous with respect to ease of removal. As the anti-reflecting layer 284, an anti-reflecting material capable of absorbing exposure light having a wavelength of 248 nm, 193 nm, or less, is preferred. Such materials are known to those skilled in the art, and particularly useful anti-reflecting materials are disclosed in U.S. Published patent application No. 10/400, 029, which is commonly owned by the same assignee. This patent application is incorporated herein by reference in its entirety as fully disclosed in the present invention. The anti-reflecting layer 284 is preferably formed to a thickness of about 500-700 Å. In a case where the diffusion barrier layer 282 is formed of a material inherently having the anti-reflecting function, the step of forming the anti-reflecting layer 284 can be omitted.

After a photoresist layer 285 transparent to exposure light (represented by arrows 302) having a wavelength of 248 nm, 193 nm, or less is formed on the anti-reflecting layer 284 (or on the diffusion barrier layer 282 if the anti-reflecting layer 284 is omitted), the photoresist layer 285 is exposed continuously to the exposure light using a mask 300 to define a trench of desired dimensions. If the exposure light 302 having a wavelength of 248 nm, 193 nm, or less is transmitted through a transmission region 301 of the mask 300 and irradiated on the photoresist layer 285, acids H+ will be generated from a photoacid generator which can be included in an exposure portion 285b of the photoresist layer 285 As shown in FIG. 16, the anti-reflecting layer 284 along a lower portion of the exposure portion 285b prevents light transmitted through the photoresist layer 285 from being reflected back through the photoresist layer 285. In a case where the diffusion barrier layer 282 has anti-reflecting properties such that the anti-reflecting layer 284 is not formed, the diffusion barrier layer 282 can instead be selected to prevent reflection of light. As a result of the light exposure step, the portion of the photoresist layer 285 forming the exposure portion 285b is hydrolyzed into a material which can be dissolved during the subsequent developing solution step by the acids H+ generated within the exposure portion 285b. Acidolysis of the photoresist layer 285 can be accelerated by a post-exposure baking step.

The diffusion barrier layer 282 prevents the base materials from diffusing into the photoresist layer during the light exposure step and during the post-exposure baking step. Thus, base materials (N:) such as nitrogen or amine remaining in the ILD 130 are diffused (as illustrated by a dotted line in FIG. 16) along the via filler 262 by the nitrogen-based etch gas which is used for etching the via 150 or during the plasma process which uses nitrogen for removing a photoresist pattern defining the via 150, so that the base materials (N:) are effectively blocked from reaching the exposure portion 285b of the photoresist layer. As a result, H+ generated in the exposure portion 285b is not neutralized by the outgassed base materials (N:) so that a mechanism for generating photoresist poisoning is thereby prevented.

Figure 17:
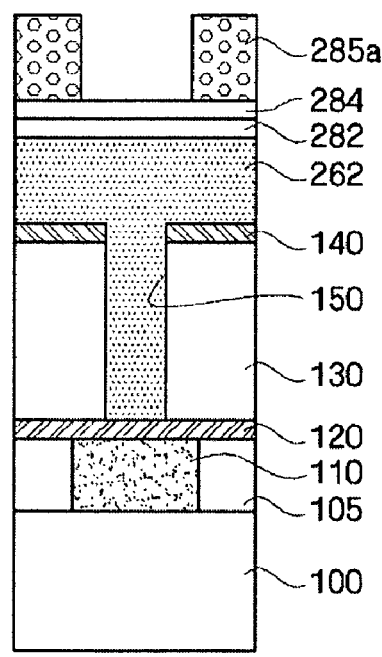

Referring now to FIG. 17, in the next process step a photoresist pattern 285a is formed. If the post-exposure baked photoresist layer 285 is immersed in a tetramethylammonium hydroxide developing solution, only the exposure portion 285b will be dissolved in the developing solution and thereby be removed. In this manner, the photoresist pattern 285a as shown in FIG. 17 is formed. Here, the diffusion barrier layer 282 is protected from exposure to the developing solution by the anti-reflecting layer 284. In a case where the diffusion barrier layer 282 is processed by plasma, as discussed above, even though an anti-reflecting layer 284 may be omitted, the diffusion barrier layer 282 will not be damaged by the developing solution. Further, in a case where the diffusion barrier layer 282 includes the dissolution inhibitor, even though an anti-reflecting layer 284 may be omitted, the diffusion barrier layer 282 will not be damaged by the developing solution.

Figure 18:
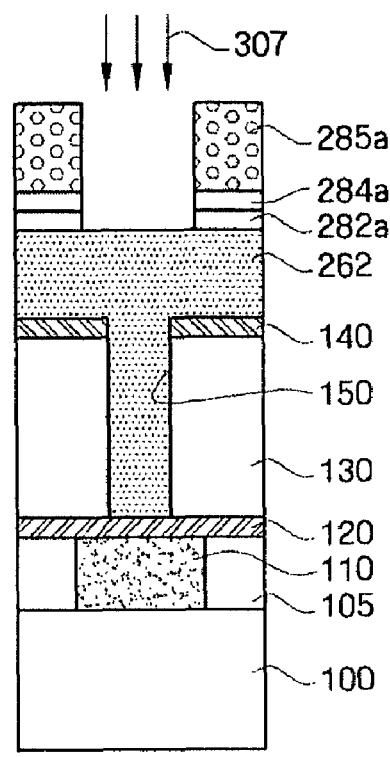

Referring next to FIG. 18, an anti-reflecting layer pattern 284a corresponding to the photoresist pattern 285a, and a diffusion barrier layer pattern 282a also corresponding to the photoresist pattern 285a are formed by a dry etching process (represented by the arrows 307) using the photoresist pattern 285a as an etch mask. The dry etching process 307 is preferably performed using a RIE process which uses a mixture of a main etch gas, such as a material having a general chemical formula CxFy or CxHyFz, together with an inert gas such as Ar gas, or a mixture which further includes at least one member selected from $O_2$, $N_2$ and $CO_x$, such that the necessary process conditions can be satisfied.

Figure 19:
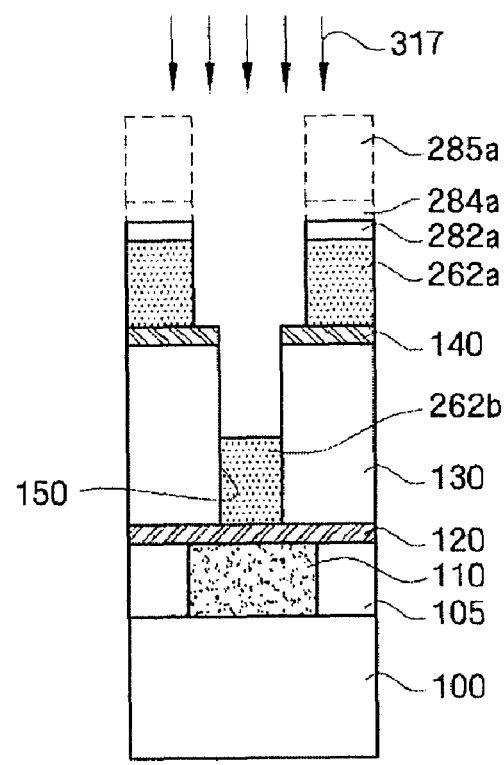

Referring now to FIG. 19, the via filler 262 used for the mask is dry etched (represented by arrows 317) in the next process step, so that a mask for forming a multi-stack mask for forming a trench (which is in turn comprised of a filler pattern 262a and the diffusion barrier layer pattern 282a) is formed. It is advantageous in this dry etching step 317 that the photoresist pattern 285a and the anti-reflecting pattern 284a be removed together in order to lower an aspect ratio during a subsequent trench formation process. As shown in FIG. 19, one portion of the via filler 262 for the mask within the via 150 is etched while a second portion 262b of the via filler still remains. An upper surface of the remaining via filler 262b can be controlled to be lower than a bottom surface of the trench in consideration of a subsequent trench etching process. The dry etching process 317 is performed under the process condition that the capping layer 140 and the ILD 130 are not etched and the via filler 262 for the mask is etched selectively. For example, $H_2$, $N_2/H_2$, $NH_3/H_2$, $He/H_2$ or a mixture thereof may be used as a main etching gas, a material with the general chemical formula CxHyFz may be used as an auxiliary etching gas, or $O_2$ gas may be added as part of the dry etching process 317.

Figure 20:
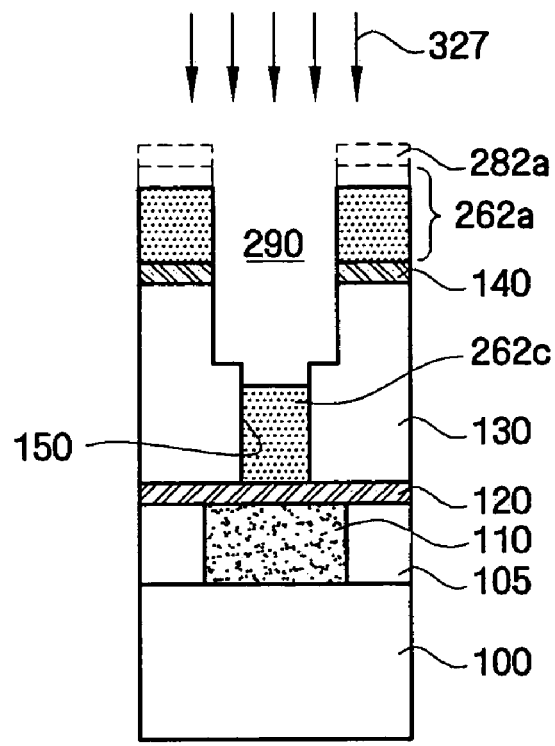

Referring now to FIG. 20, the capping layer 140 and the ILD 130 are dry etched (as represented by the arrows 327) using the multi-stack mask as the etch mask so that a trench 290 is formed. Since the filler pattern 262a used as a mask for forming the trench is formed of SOP, or the like, which has a high resistance to dry etching as described above, the mask 262a for forming the trench is not damaged in the dry etching process and fully performs its function as a mask so that the trench 290 is formed having a good profile. It is thereafter easy to remove the mask 262a used for forming the trench in a subsequent process by first removing the diffusion barrier layer pattern 282a, for example during the dry etching process 327. The via filler 262b remaining in the structure/device prior to the dry etching process 327 is etched so that only a portion 262c of the via filler 262b as shown in FIG. 19 still remains: The dry etching process 327 is preferably performed under the process condition that the etch stop layer 120 is not exposed and a small amount of the via filler 262c for the mask remains within the via 150 on a lower portion of the trench 290. For example, if the dry etching process is carried out using CxFy gas as a main etch gas and $N_2$ gas or Ar gas as an additional gas component, the foregoing preferred conditions for conducting the dry etching process 327 can be readily achieved.

Figure 21:
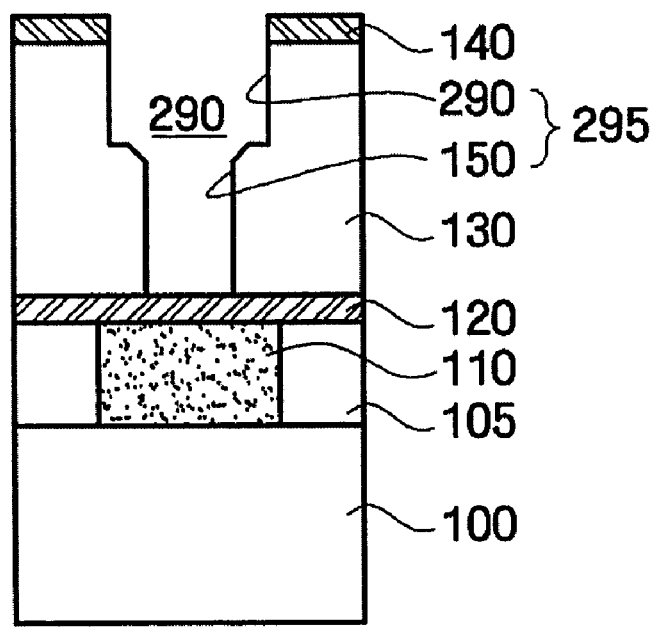

FIG. 21 is a schematic cross-sectional view showing the resultant structure of FIG. 20 after removing the mask 262a for forming the trench and the remaining via filler 262c. After the trench etching is completed, the mask 262a for forming the trench and the remaining via filler 262c are preferably simultaneously removed in an ashing process using the $H_2$-based plasma obtained from $H_2$, $N_2/H_2$, $NH_3/H_2$, $He/H_2$, or a mixture thereof so that a dual damascene interconnection region 295, comprised of the via 150 and the trench 290, is formed. Since the ILD 130 is not etched and the mask 262a for forming the trench and the remaining via filler 262c are removed in the ashing process, the familiar conventional problem with this technological field (namely, that the ILD 130 is etched when the via filler 262c is removed so that the critical dimension of the trench 290 cannot be controlled precisely is solved. Following the ashing process, polymer, or the like material remaining after the ashing process, is completely removed in a wet etching process using an organic stripper, or similar chemical.

Figure 22:
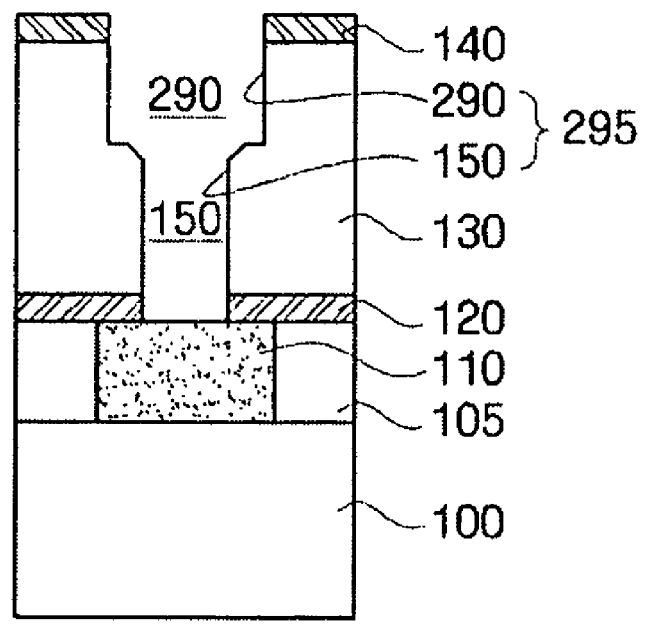

Referring next to FIG. 22, in the next process step the etch stop layer 120 exposed by the via 150 is etched so that the lower interconnection 110 is exposed, thereby completing formation of the dual damascene interconnection region 295 comprised of the via 150 and the trench 290. The etch stop layer 120 is etched under the process condition that the lower interconnection 110 is not affected by the etching of the etch stop layer 120 and only the etch stop layer 120 is removed selectively.

Figure 23:
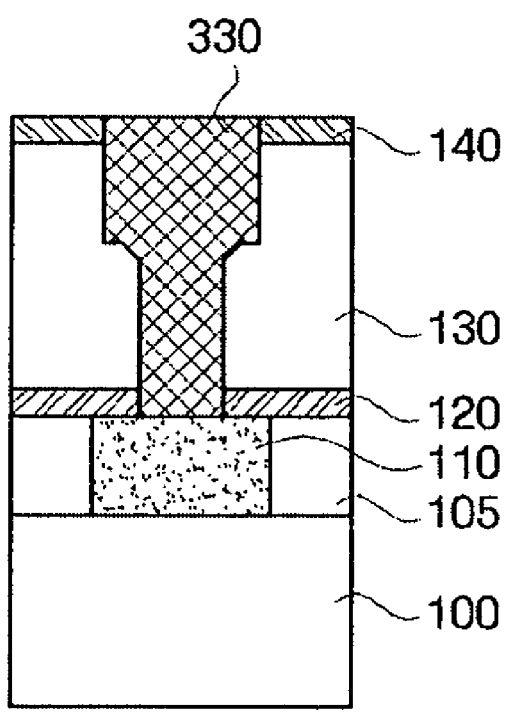

Referring finally to FIG. 23, in the last steps of the process a conductive layer is formed on the dual damascene interconnection area 295 and then is planarized so that dual damascene interconnections 330 are formed. The conductive layer can be selected from aluminum, tungsten, copper or an alloy thereof, and copper is usually the most preferable from the viewpoint of low electrical resistance. Further, a stacking structure consisting of a diffusion barrier layer and/or a main interconnection layer can also be formed on the structure and can be variously changed using technologies known to those skilled in this art.

The present invention will be described in more detail with reference to the following non-limiting experimental examples.

EXPERIMENTAL EXAMPLE 1

After a CVD OSG (k=2.9) as an ILD was formed on a substrate to a thickness of 7,000 Å, a via was formed, and some base materials (N:) such as nitrogen or amine remained within the ILD as the result of an ashing process using nitrogen-based plasma. Subsequently, after an HSQ-based material (in the above formula (1), R is octadecyl, x is 0.24, and y is 0.76) was formed on the CVD OSG to a thickness of 2,000 Å, photoresist for ArF was formed thereon. Then, a photoresist pattern defining a trench was formed after going through exposure using exposure light having a wavelength of 193 nm and development using a tetramethylammonium hydroxide developing solution, thereby preparing a first test sample in accordance with the present invention.

After a CVD OSG (k=2.9) as an ILD was formed on a substrate to a thickness of 7,000 Å, some base materials (N:) such as nitrogen or amine remained within the ILD as the result of a nitrogen-based plasma process. Subsequently, after MSQ was formed on the CVD OSG to a thickness of 2,000 Å, photoresist for ArF was formed thereon. Then, a photoresist pattern defining a trench was formed after going through exposure using exposure light having a wavelength of 193 nm and development using a tetramethylammonium hydroxide developing solution, thereby preparing a second test sample for comparison purposes. This second test sample was not prepared in accordance with the present invention.

The comparison of the photoresist patterns of the first test sample and the second test sample was made using a scanning electron microscope (SEM). The SEM image confirms that the first test sample (present invention) had a good photoresist pattern while the photoresist pattern obtained from the second test sample was defective.

EXPERIMENTAL EXAMPLE 2

Figure 24:
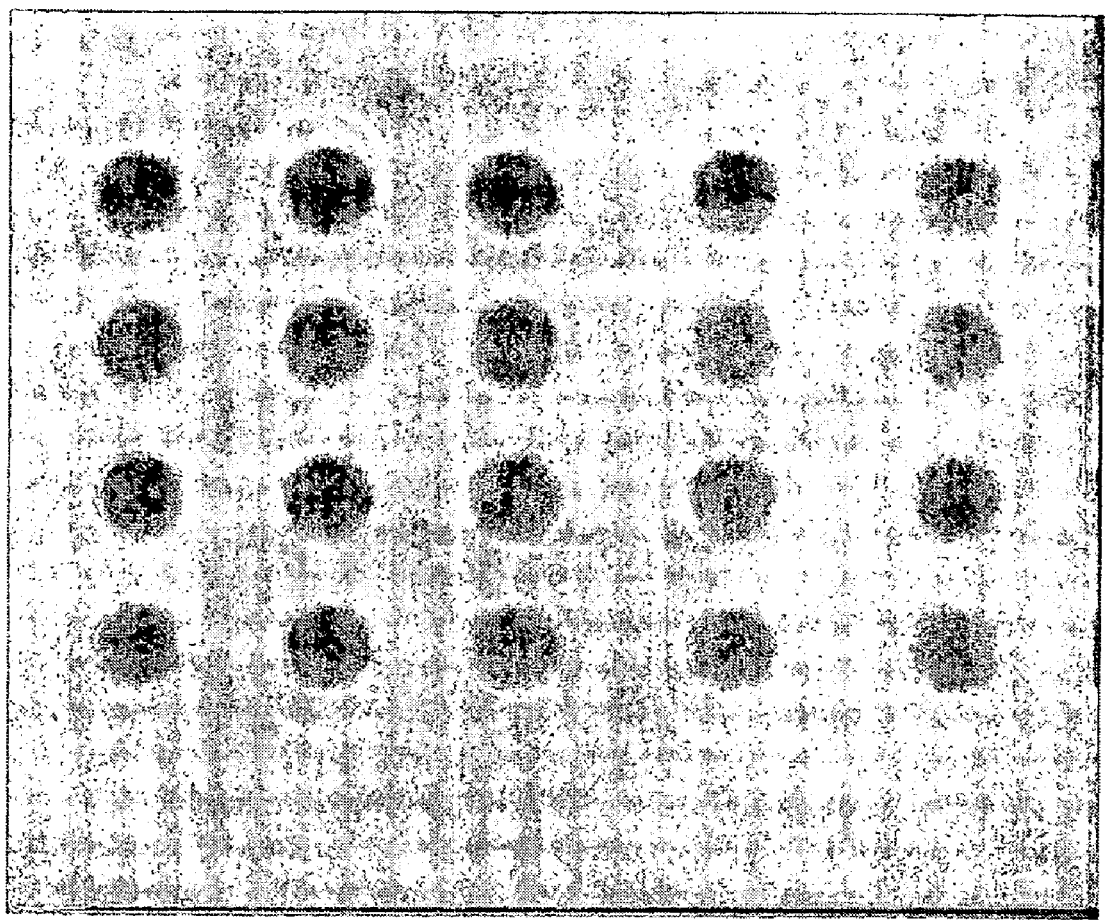
FIG. 24 is a SEM image taken after forming a photoresist pattern defining a trench for the dual damascene interconnections according to the first embodiment of the present invention.

The first embodiment of the present invention was applied to fabricating a logic device having dual damascene interconnections of a 90 nm-design-rule logic device with embedded 1.1 μm² 6Tr-SRAM. Thus, a photoresist pattern defining a trench with dual damascene interconnections according to the present invention was formed. SEM imaging of the resultant structure is shown in FIG. 24. It can be seen that the formed photoresist pattern had no observable damage, which represents a significant improvement over the prior art.

According to a method of fabricating dual damascene interconnections according to one embodiment of the present invention, an ILD is formed of a hybrid low-k material and a via filler may be formed of an HSQ-based material having a diffusion barrier characteristic to protect against base materials and also having an anti-reflecting function. As a result, photoresist poisoning is suppressed, an etch stop layer protecting a lower interconnection is not damaged, a depth of focus (DOF) margin is improved in a photolithographic etching process, fence defects (which adversely affect electrical properties of the dual damascene interconnections) are not generated, and the width and the critical dimension of a trench are held constant.

In addition, according to a method of fabricating dual damascene interconnections using a multi-stack mask according to another embodiment of the present invention, the multi-stack mask is formed of a polymer layer, a diffusion barrier layer to protect against base materials, and a photoresist pattern which have high resistance to dry etching. As a result, damage to the photoresist pattern is not generated and resistance to the dry etching is improved when the trench is formed, thereby making it possible to form a trench having good profile characteristics.

Further, since the ILD is formed of a low-k material in the above embodiment of the present invention, RC signal delay of the dual damascene interconnections can be prevented and mutual interference between the dual damascene interconnections and an increase in power consumption can be suppressed.

The present invention has been described in detail with reference to preferred embodiments thereof, and although specific terms are employed, they are used and are to be interpreted in a generic and a descriptive sense only and not for purpose of limitation. Accordingly, it will be understood to those of ordinary skill in the art that various changes, substitutions and alterations in form and details may be made without departing from the spirit and scope of the present invention as set forth in the following claims.

What is claimed is:

1. A method of fabricating dual damascene interconnections suitable for a microelectronic device, said method comprising the sequential steps of:
    (a) forming a low-k interlayer dielectric layer having a low dielectric constant on a substrate;
    (b) forming a via within the interlayer dielectric layer;
    (c) filling the via with a hydrogen silsesquioxane (HSQ)-based filler expressed by the following general chemical formula:

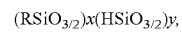

$(RSiO_{3/2})x(HSiO_{3/2})y$, wherein x and y satisfy the relationships x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, and substituted C1-C4 hydrocarbon groups;
    (d) partially etching the filler filling the via and the interlayer dielectric layer to form a trench which is connected to the via in the region where the dual damascene interconnections are to be formed;
    (e) removing the filler remaining in the via; and
    (f) filling the trench and the via with an interconnection material to complete the dual damascene interconnections.

2. The method of claim 1, wherein the interlayer dielectric layer is a hybrid dielectric layer having a dielectric constant of about 3.3 or less.

3. The method of claim 2, wherein the hybrid dielectric layer is an organo silicate glass layer.

4. The method of claim 2, wherein step (a) is performed using chemical vapor deposition (CVD).

5. The method of claim 1, wherein the filler further includes a dissolution inhibitor for a photoresist developer.

6. The method of claim 1, further comprising the following steps carried out before step (a):
forming a lower interconnection on the substrate; and
forming an etch stop layer on the lower interconnection, further wherein step (b) comprises forming the via so as to expose the etch stop layer, and
wherein step (f) is preceded by the added step of removing the etch stop layer exposed by the via to expose the lower interconnection.

7. The method of claim 6, wherein the etch stop layer is formed of SiC, SiN or SiCN.

8. The method of claim 1, further comprising the following step carried out after step (a) and before step (b): forming a capping layer on the interlayer dielectric, and wherein step (b) additionally comprises forming the via within the capping layer and the interlayer dielectric.

9. The method of claim 8, wherein the capping layer is formed of a material selected from the group consisting of $SiO_2$, SiOF, SiON, SiC, SiN, and SiCN.

10. The method of claim 1; further comprising the following step carried out after step (c) and before step (d): processing a surface of the filler by a plasma treatment.

11. The method of claim 10, wherein the plasma is plasma obtained from $O_2$, $H_2$, He, $NH_3$, $N_2$, Ar gas, or a mixture thereof.

12. The method of claim 1, wherein step (d) comprises the following substeps:
forming a photoresist pattern to define a trench on the filler;
dry etching the filler and the interlayer dielectric layer using the photoresist pattern as an etch mask under process conditions such that a dry etch selectivity of the filler relative to the interlayer dielectric is about 4:1 or lower, to form a trench; and
removing the photoresist pattern.

13. The method of claim 12, wherein the dry etching uses a gas having the general chemical formula CxFy or CxHyFz as a principal etching gas, and the photoresist pattern is removed using $H_2$-based plasma.

14. The method of claim 1, further wherein step (e) comprises the step of wet etching the filler and the interlayer dielectric layer under process conditions such that a wet etch selectivity of the filler relative to the interlayer dielectric layer is about 20:1 or higher.

15. The method of claim 14, wherein the wet etching step uses a diluted HF solution; a mixed solution of $NH_4F$, HF and a deionized water; or, an organic solution containing demethylacethylamide.

16. The method of claim 1, wherein the interconnection material is copper.

17. A method of fabricating dual damascene interconnections suitable for a microelectronic device, said method comprising the sequential steps of:
(a) forming a lower interconnection on a substrate;
(b) forming an etch stop layer on the lower interconnection;
(c) forming an organo silicate glass layer on the etch stop layer;
(d) forming a via so as to expose the etch stop layer within the organo silicate glass layer;
(e) filling the via with an HSQ-based filler expressed by the general chemical formula:

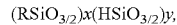

wherein x and y satisfy the relationships x+y=1 and 0<x<y<1, and also where R is selected from the group consisting of C4-C24 alkyl groups, C4-C24 alkenyl groups, C4-C24 alkoxy groups, C8-C24 alkenoxy groups, substituted C4-C24 hydrocarbon groups, and substituted C1-C4 hydrocarbon groups;
(f) partially etching the filler filling the via and the organo silicate glass layer to form a trench which is connected to the via in the region where the dual damascene interconnections are to be formed;
(g) removing the filler remaining in the via; and
(h) filling the trench and the via with an interconnection material to complete the dual damascene interconnections.

18. A method of fabricating dual damascene interconnections suitable for a microelectronic device, said method comprising the sequential steps of:
(a) forming a low-k interlayer dielectric layer having a low dielectric constant on a substrate;
(b) forming a via within the interlayer dielectric layer;
(c) forming a filler for a mask which is made of spin-on-polymer (SOP) so as to fill the via and cover the interlayer dielectric layer;
(d) forming a diffusion barrier layer to protect against base materials, wherein said barrier layer is made of HSQ or an HSQ-based material, on an upper portion of the filler, the HSQ-based material being expressed by the general chemical formula:

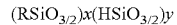

wherein x and y satisfy the relationships x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups and substituted C1-C4 hydrocarbon groups;
(e) forming a photoresist pattern so as to define a trench area where the dual damascene interconnections are to be formed on the diffusion barrier layer;
(f) etching the diffusion barrier layer using the photoresist pattern as an etch mask to form a diffusion barrier layer pattern;
(g) etching the filler on the interlayer dielectric layer using the photoresist pattern and the diffusion barrier layer pattern as an etch mask to form a multi-stack mask including the diffusion barrier layer pattern and a filler pattern;
(h) partially etching the interlayer dielectric layer using the multi-stack mask as an etch mask to form a trench which is connected to the via in the region where the dual damascene interconnections are to be formed;
(i) removing the multi-stack mask and the filler remaining in the via;
(j) removing the etch stop layer exposed by the via to expose a lower interconnection; and (k) filling the trench and the via with an interconnection material to complete the dual damascene interconnections.

19. The method of claim 18, wherein the interlayer dielectric layer having a low dielectric constant is a hybrid dielectric layer having a dielectric constant of about 3.3 or less.

20. The method of claim 19, wherein the hybrid dielectric layer is an organo silicate glass layer.

21. The method of claim 19, wherein step (a) is performed using chemical vapor deposition (CVD).

22. The method of claim 18, wherein the diffusion barrier layer further includes a dissolution inhibitor for a photoresist developer.

23. The method of claim 18, further comprising the following steps carried out before step (a):
forming a lower interconnection on the substrate; and
forming an etch stop layer on the lower interconnection,
further wherein step (b) comprises forming the via so as to expose the etch stop layer, and
wherein step (j) is preceded by the added step of removing the etch stop layer exposed by the via to expose the lower interconnection.

24. The method of claim 23, wherein the etch stop layer is formed of SiC, SiN, or SiCN.

25. The method of claim 18, further comprising the following step carried out after step (a) and before step (b): forming a capping layer on the interlayer dielectric, and
wherein step (b) additionally comprises forming the via within the capping layer and the interlayer dielectric.

26. The method of claim 25, wherein the capping layer is formed of a material selected from the group consisting of $SiO_2$, SiOF, SiON, SiC, SiN, and SiCN.

27. The method of claim 18, further comprising the following step carried out before step (e): forming an anti-reflective layer on the diffusion barrier layer, and
further wherein step (f) comprises etching the anti-reflective layer and the diffusion barrier layer using the photoresist pattern as an etch mask to form an anti-reflective layer pattern and a diffusion barrier layer pattern, and
wherein step (g) comprises etching the filler using the photoresist pattern, the anti-reflective layer pattern and the diffusion barrier layer pattern as an etch mask to form the multi-stack mask.

28. The method of claim 27, wherein step (g) includes removing the photoresist pattern and the anti-reflective layer pattern during the etching of the filler, and the resulting multi-stack mask includes the diffusion barrier layer pattern and the filler pattern.

29. The method of claim 18, wherein the etching step of step (f) uses a gas having the general chemical formula CxFy or CxHyFz as a principal etching gas.

30. The method of claim 18, wherein an upper surface of the remaining via filler remaining in the via following step (g) is lower than a bottom surface of the trench.

31. The method of claim 18, wherein as part of step (g), the photoresist pattern is removed.

32. The method of claim 18, wherein in step (g), dry etching is performed using a gas selected from the group consisting of $H_2$, $N_2/H_2$, $NH_3/H_2$, $He/H_2$, and mixtures thereof as a principal etching gas and also using CxHyFz gas as an auxiliary etching gas.

33. The method of claim 18, wherein as part of step (h), the diffusion barrier layer pattern is etched and removed together with the interlayer dielectric layer.

34. The method of claim 18, wherein in step (h), dry etching is performed using CxFy gas as a principal etching gas.

35. The method of claim 18, wherein in step (i), the multi-stack mask and remaining filler are removed using $H_2$-based plasma.

36. The method of claim 18, further comprising the following step carried out before step (j): wet etching the substrate having the trench.

37. The method of claim 18, wherein the interconnection material is copper.

38. A method of fabricating dual damascene interconnections suitable for a microelectronic device, said method comprising the sequential steps of:
(a) forming a lower interconnection on a substrate;
(b) forming an etch stop layer on the lower interconnection;
(c) forming an organo silicate glass layer on the etch stop layer;
(d) forming a via so as to expose the etch stop layer within the organo silicate glass layer;
(e) forming a filler for a mask which is made of spin-on-polymer (SOP) so as to fill the via and cover the organo silicate glass layer;
(f) forming a diffusion barrier layer to protect against base materials, wherein said barrier layer is made of HSQ or an HSQ-based material, on an upper portion of the filler, the HSQ-based material being expressed by the general chemical formula:

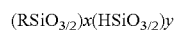

$(RSiO_{3/2})x(HSiO_{3/2})y$ wherein x and y satisfy the relationships x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups and substituted C1-C4 hydrocarbon groups;

(g) forming a photoresist pattern so as to define a trench area where the dual damascene interconnections are to be formed on the diffusion barrier layer;
(h) etching the diffusion barrier layer using the photoresist pattern as an etch mask to form a diffusion barrier layer pattern;
(i) etching the filler on the organo silicate glass layer using the photoresist pattern and the diffusion barrier layer pattern as an etch mask to form a multi-stack mask including the diffusion barrier layer pattern and a filler pattern and, simultaneously to remove the photoresist pattern;
(j) partially etching the organo silicate glass layer using the multi-stack mask as an etch mask to form a trench which is connected to the via in the region where the dual damascene interconnections are to be formed, and to simultaneously remove the diffusion barrier pattern;
(k) removing the filler pattern and the filler remaining in the via;
(l) wet etching the resultant structures to remove the remaining impurities;
(m) removing the etch stop layer exposed by the via to expose the lower interconnection; and
(n) filling the trench and the via with an interconnection material to complete the dual damascene interconnections.

39. A method of fabricating dual damascene interconnections suitable for a microelectronic device, said method comprising the sequential steps of:
(a) forming a low-k interlayer dielectric layer having a low dielectric constant on a substrate;
(b) forming a via within the interlayer dielectric layer;
(c) filling the via with a filler that includes a hydrogen silsesquioxane (HSQ)-based filler expressed by the following general chemical formula:

$(RSiO_{3/2})x(HSiO_{3/2})y,$ wherein x and y satisfy the relationships x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups and substituted C1-C4 hydrocarbon groups, and that further includes a dissolution inhibitor for a photoresist developer;

(d) partially etching the filler filling the via and the interlayer dielectric layer to form a trench which is connected to the via in the region where the dual damascene interconnections are to be formed;

(e) removing the filler remaining in the via; and (f) filling the trench and the via with an interconnection material to complete the dual damascene interconnections.

40. A method of fabricating dual damascene interconnections suitable for a microelectronic device, said method comprising the sequential steps of:

(a) forming a low-k interlayer dielectric layer having a low dielectric constant on a substrate;

(b) forming a via within the interlayer dielectric layer;

(c) filling the via with a hydrogen silsesquioxane (HSQ)-based filler expressed by the following general chemical formula:

$(RSiO_{3/2})x(HSiO_{3/2})y,$ wherein x and y satisfy the relationships x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups and substituted C1-C4 hydrocarbon groups;

(d) processing a surface of the filler by a plasma treatment;

(e) partially etching the filler filling the via and the interlayer dielectric layer to form a trench which is connected to the via in the region where the dual damascene interconnections are to be formed;

(f) removing the filler remaining in the via; and (g) filling the trench and the via with an interconnection material to complete the dual damascene interconnections.

41. The method of claim 40, wherein the plasma is plasma obtained from $O_2$, $H_2$, He, $NH_3$, $N_2$, Ar gas, or a mixture thereof.

42. A method of fabricating dual damascene interconnections suitable for a microelectronic device, said method comprising the sequential steps of:

(a) forming a low-k interlayer dielectric layer having a low dielectric constant on a substrate;

(b) forming a via within the interlayer dielectric layer;

(c) filling the via with a hydrogen silsesquioxane (HSQ)-based filler expressed by the following general chemical formula:

$(RSiO_{3/2})x(HSiO_{3/2})y,$ wherein x and y satisfy the relationships x+y=1 and 0<x<y<1, and also wherein R is selected from the group consisting of C4-C24 alkyl groups, C4-C24 alkenyl groups, C4-C24 alkoxy groups, C8-C24 alkenoxy groups, substituted C4-C24 hydrocarbon groups, non-substituted C1-C4 hydrocarbon groups and substituted C1-C4 hydrocarbon groups;

(d) partially etching the filler filling the via and the interlayer dielectric layer to form a trench which is connected to the via in the region where the dual damascene interconnections are to be formed;

(e) removing the filler remaining in the via by the step of wet etching the filler and the interlayer dielectric layer under process conditions such that a wet etch selectivity of the filler relative to the interlayer dielectric layer is about 20:1 or higher; and (f) filling the trench and the via with an interconnection material to complete the dual damascene interconnections.

43. The method of claim 42, wherein the wet etching step uses a diluted HF solution; a mixed solution of $NH_4F$, HF and a deionized water; or, an organic solution containing demethylacethylamide.

* * * * *